US008970222B2

(12) United States Patent
Juhlin

(10) Patent No.: US 8,970,222 B2
(45) Date of Patent: Mar. 3, 2015

(54) LINE FAULT DETECTOR

(75) Inventor: Lars-Erik Juhlin, Ludvika (SE)

(73) Assignee: ABB Technology AG, Zurich (CH)

( * ) Notice: Subject to any disclaimer, the term of this patent is extended or adjusted under 35 U.S.C. 154(b) by 208 days.

(21) Appl. No.: 13/512,835

(22) PCT Filed: Dec. 10, 2009

(86) PCT No.: PCT/EP2009/066848
§ 371 (c)(1),
(2), (4) Date: Jun. 27, 2012

(87) PCT Pub. No.: WO2011/069548
PCT Pub. Date: Jun. 16, 2011

(65) Prior Publication Data
US 2012/0256637 A1    Oct. 11, 2012

(51) Int. Cl.
| | | |
|---|---|---|
| *G01R 31/08* | (2006.01) | |
| *H02H 7/26* | (2006.01) | |
| *G01R 31/11* | (2006.01) | |
| *H02H 5/10* | (2006.01) | |
| *H02J 3/36* | (2006.01) | |
| *H02H 3/17* | (2006.01) | |

(52) U.S. Cl.
CPC ............... *H02H 7/268* (2013.01); *G01R 31/11* (2013.01); *H02H 5/105* (2013.01); *H02J 3/36* (2013.01); *Y02E 60/60* (2013.01); *H02H 3/17* (2013.01)
USPC ........................................................ 324/523

(58) Field of Classification Search
CPC ....... G01R 31/11; H02H 5/105; H02H 7/268; H02J 3/36
USPC .................. 324/523, 527, 534, 541, 508, 509
See application file for complete search history.

(56) References Cited

U.S. PATENT DOCUMENTS 5,608,328 A * 3/1997 Sanderson .................... 324/529
6,385,561 B1 * 5/2002 Soraghan et al. ............. 702/185
(Continued)

FOREIGN PATENT DOCUMENTS

WO    WO 2007/084040 A1    7/2007

OTHER PUBLICATIONS

Yu Jiangguo et al.: "Reliable Control and Protection System for the Tian—Guang HVDC Transmission Project", Power System Technology, 2002, Proceedings, Powercon 2002, vol. 2, Oct. 13, 2002, pp. 688-695.

*Primary Examiner* — Jermele M Hollington
(74) *Attorney, Agent, or Firm* — Birch, Stewart, Kolasch & Birch, LLP

(57) ABSTRACT

The present invention relates to a fault detection system for detection of line faults on an electrode line in an HVDC system wherein the electrode line comprises a first and second branch connected in parallel. The fault detection system comprises a first and second pulse generation circuit arranged to generate electrical pulses onto the first and second branches, respectively, as well as first and second current measurement devices arranged to generate signals indicative of electrical signals occurring in first and second injection lines, respectively. The possibility of independent generation of electrical pulses onto the first and second branches, respectively, as well as the independent registration of first and second signal patterns representing electrical signals on the first and second injection lines, respectively, increases the information content in the collected data, thereby facilitating for a more reliable analysis of whether or not a fault is present on the electrode line.

20 Claims, 9 Drawing Sheets

(56) References Cited

U.S. PATENT DOCUMENTS

| | | |
|---|---|---|
| 6,518,769 B1 | 2/2003 | Ammon et al. |
| 6,879,164 B2 * | 4/2005 | Kollenda et al. ............... 324/551 |
| 7,679,371 B1 * | 3/2010 | Lo .................................. 324/533 |

* cited by examiner

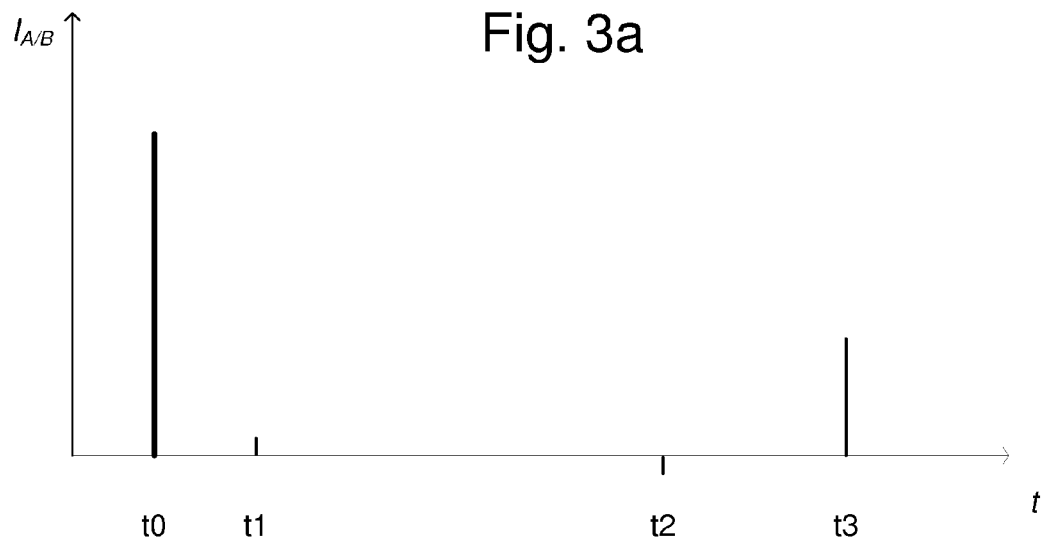
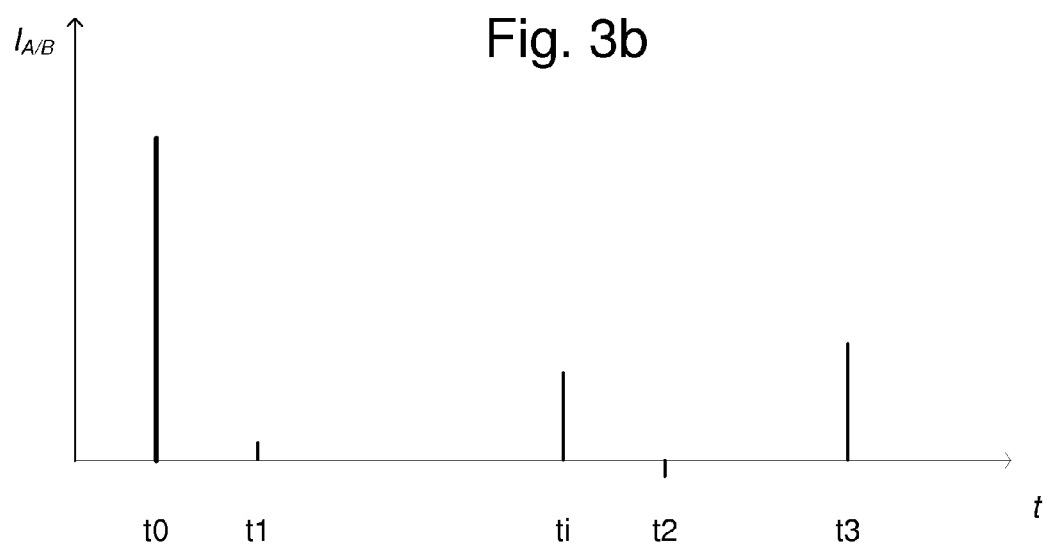

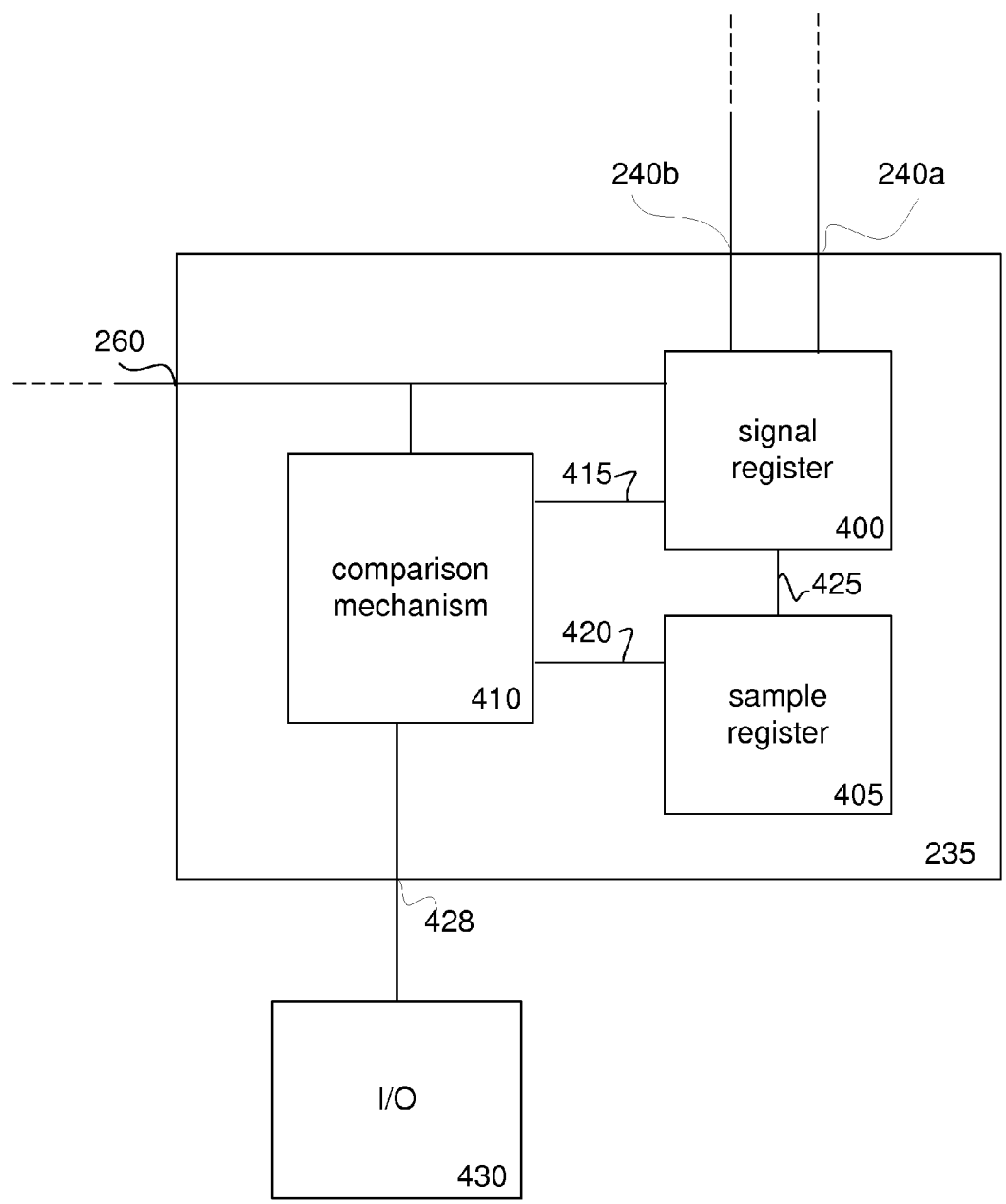

210a/b

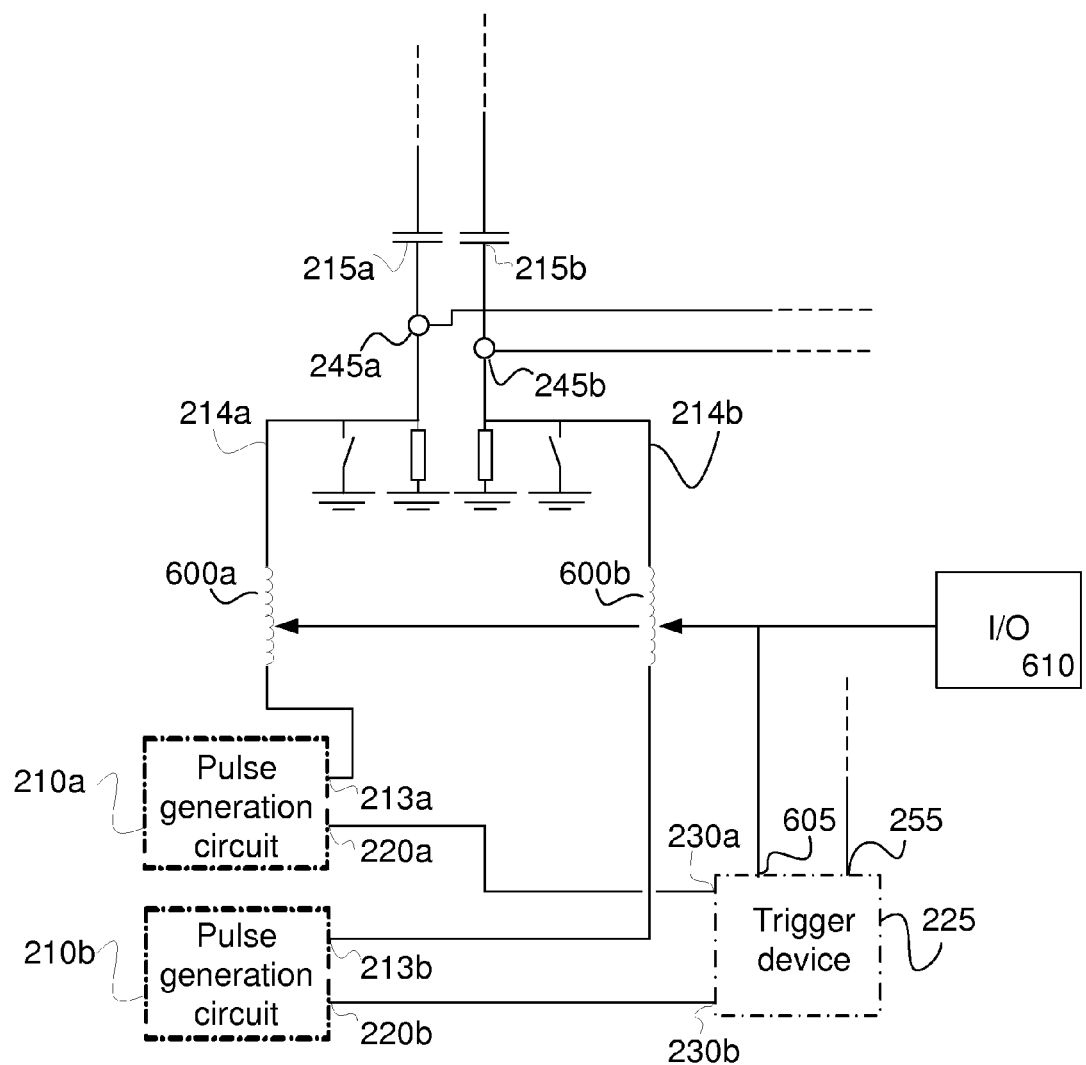

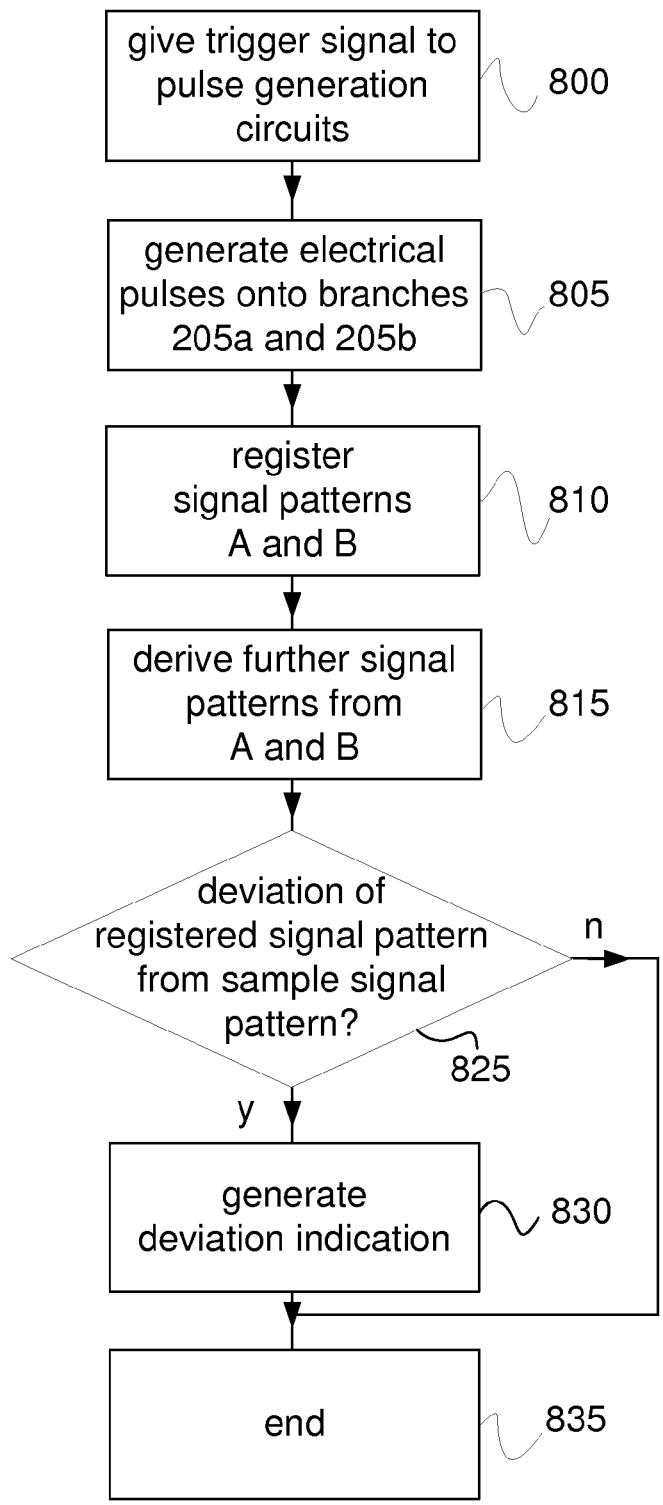

LINE FAULT DETECTOR

TECHNICAL FIELD

The present invention relates to the field of high voltage direct current power transmission, and in particular to fault detection in electrode lines of high voltage direct current power transmission systems.

BACKGROUND

In an HVDC system, two or more HVDC converter stations are connected by means of one or more HVDC lines, where an HVDC line is used for carrying a high voltage direct current from one HVDC converter station to another. In monopolar HVDC transmission, a single HVDC line connects two HVDC converter stations, and the current can be returned via earth. In bipolar HVDC transmission, two HVDC converter stations are connected by means of two HVDC lines. The current can hence be returned via an HVDC line, and in normal operation, there is no unbalanced earth or neutral current. However, if an outage occurs in one of the converters in a bipolar system, the current must be returned via earth, or via a neutral conductor.

In order to avoid that any unbalanced current causes unacceptable interference or corrosion, the part of an HVDC converter station having the potential closest to ground, often referred to as station neutral, is typically connected to a remotely located ground electrode via an electrode line or to the station neutral of another HVDC converter station via a metallic return conductor between two HVDC converter stations. In the latter case, the station neutral of both HVDC converter stations are connected to earth at one point only, which may for example be the earth grid of one of the HVDC converter stations, and hence, there is no earth current.

The operation voltage of an electrode line is low. Typically, the operating voltage of an electrode line at rated current in the HVDC line(s) is a few kV, while the operating voltage of a metallic return conductor is often larger, since a metallic return conductor is typically longer. In a bipolar HVDC system, the electrode line current, and hence the electrode line voltage, is nil at balanced operation. Hence, since a fault does not imply any significant reduction of the electrode line voltage, any fault on an electrode line could remain undetected for a long time, unless special measures are taken.

The length of an electrode line is often 20 kilometers or more, in order to ensure that any strong currents will be led to a geographical position where injection of the line current in the earth electrode will cause no or little interference with the HVDC station or with the surroundings, for example by way of corrosion. The grounded electrode of an electrode line is typically located at a geographical position having low resistance to remote earth (e.g. to the earth's magma), and which is at a sufficient distance from any towns, underground pipes, railroads etc.

In the following, the term electrode line will be used to refer to a metallic return conductor, as well as to an electrode line connecting the DC station neutral of an HVDC station to a ground electrode.

An electrode line with an earth fault could cause a safety hazard, since currents being led via the electrode line would then be led to an uncontrolled geographical position, possibly harming humans as well causing corrosion on local infrastructure. Furthermore, in case of a pole outage in a bipolar system, the remaining pole will typically also have to be tripped if the electrode line has a ground fault, in order to clear the electrode line ground fault. Such outages of both poles are very costly, both for society in general and for the HVDC line operator. Also under normal operating conditions, an electrode line with an earth fault could cause damage to the surroundings, for example corrosion in underground pipes.

Hence, means for monitoring electrode lines in an HVDC system in order to detect faults, such as ground faults or short circuits, are desired. Furthermore, since the electrode lines typically extend over 10's of kilometers, it is often desirable not only to detect the presence of a line fault, but also to determine the approximate location of the fault, so that the fault can be easily and quickly attended to.

A method of detecting a faulty electrode line composed of two leads in a bipolar HVDC system is disclosed in U.S. Pat. No. 6,518,719. A balanced-to-ground pulse is formed from an unbalanced-to-ground pulse in a push/pull mode by use of a transformer having two high voltage windings and a low voltage winding, the low voltage winding being connected to an output of a pulse generator. The pulse is then fed into the two electrode leads, and an echo curve is recorded and compared to a target echo curve. The points where the pulse enters the electrode leads are located at a distance corresponding to $\lambda/4$ from the branch point, i.e. the point where the electrode line branches off into the two leads, $\lambda$ being the wavelength of the centre frequency of the feed pulse. A fault signal is generated when a tolerance band placed around the echo difference curve is exceeded.

SUMMARY

A problem to which the present invention relates is how to improve the reliability of a fault detection system for detecting faults in an electrode line in an HVDC system.

This problem is addressed by a fault detection system for detection of line faults on an electrode line in an HVDC system wherein the electrode line comprises a first and second branch connected in parallel. The line fault detecting system comprises:

- a first pulse generation circuit having a trigger input and an output connectable to the first branch via a first injection line, the first pulse generation circuit arranged to generate a first electrical pulse at the output upon receipt of a trigger signal;
- a second pulse generation circuit having a trigger input and an output connectable to the second branch via a second injection line, the second pulse generation circuit arranged to generate an electrical pulse of opposite polarity to the first pulse at the output upon receipt of a trigger signal;
- a first current measuring device arranged to generate a signal indicative of electrical signals occurring in the first branch line;
- a second current measuring device arranged to generate a signal indicative of electrical signals occurring in the second branch line; and
- a monitoring device having a connection to the first and second current measuring devices, the monitoring device being arranged to register:
- a first registered signal pattern, from the first current measuring device, the first registered signal pattern comprising signals occurring on the first branch line in response to the generation of an electrical pulse signal, and
- a second registered signal pattern, from the second current measuring device, the second registered signal pattern comprising signals occurring on the second branch line in response to the generation of an electrical pulse signal.

The problem is further addressed by a method of detecting a line fault in an electrode line in an HVDC system wherein the electrode line includes a first and second branch connected in parallel. The method comprises:

generating a first electrical pulse onto the first branch via a first injection line;

generating a second electrical pulse onto the second branch via a second injection line;

registering a first registered signal pattern representing electrical signals occurring on the first branch line in response to the generation of an electrical pulse signal; and;

registering a second registered signal pattern representing electrical signals occurring on the second branch line in response to the generation of an electrical pulse signal.

By the fault detection system and method is achieved that the quality of data collected by a fault detection system for detecting faults in an electrode line, based on which data the fault detection is performed, can be improved. The possibility of independent generation of electrical pulses onto the first and second branches, respectively, as well as the independent registration of first and second signal patterns representing electrical signals on the first and second injection lines, respectively, increases the information content in the collected data, thereby facilitating for more reliable analysis of whether or not a fault is present on the electrode line.

The independent registration of first and second signal patterns allows for the derivation of signal patterns representing both pole mode-, earth mode- and combined pole mode & earth mode-transmissions from a single fault detection event, as opposed to the prior art electrode line fault detection systems as described for example in U.S. Pat. No. 6,518,719, where only signal patterns representing pole mode transmission can be obtained. The transmission mode wherein a fault can best be discerned typically varies between the different fault types. Hence, by providing for the possibility of obtaining signal patterns representing different transmission modes, the possibilities of detecting different types of faults is improved.

The possibility of independent generation of electrical pulses onto the first and second branches allows for the collection of data in both a scenario wherein two complementary pulses are simultaneously transmitted, referred to as the simultaneous injection mode, and a scenario where electrical pulses are injected into one branch line at a time, referred to as the single signal injection mode. In the simultaneous injection mode, the two complementary pulses are magnetically and capacitively coupled, and hence, the detected signal patterns will differ between the two scenarios. As compared to the electrode line fault detection system of U.S. Pat. No. 6,518, 719 wherein only a simultaneous injection mode is available, further information about the status of the line fault detection system can be obtained.

A further advantage of the present fault detection system over that disclosed in U.S. Pat. No. 6,518,719 is that the present fault detection system may be arranged so that electrical pulses of single polarity can be used. By providing separate pulse generation circuits, no components, which will suffer from saturation if the generated electrical pulse includes a DC component, are required at the output side of a pulse generation circuit. Generally, a pulse generation circuit arranged to generate a single polarity pulse can be kept simpler than if a pulse of both polarities is to be generated.

In one embodiment, the fault detection system further comprises a comparison mechanism arranged to generate at least one further registered signal pattern from the addition and/or subtraction of the first registered signal pattern and the second registered signal pattern. Hereby is achieved that an improved analysis of the status of the electrode line can be performed within the fault detection system.

In one embodiment, the fault detection system comprises a sample register arranged to store at least one sample signal pattern indicative of an expected signal pattern to be expected in a particular scenario. Hereby is achieved that the current electrical behavior of the electrode line can be compared to the expected electrical behavior in different scenarios. In this embodiment, the fault detection system may comprise a comparison mechanism arranged to compare at least one registered signal pattern to at least one sample signal pattern, and to generate a fault indication signal if a deviation which exceeds a deviation threshold is detected. Hereby is achieved that an operator of the HVDC system may automatically receive an indication of a detected problem on the electrode line. Furthermore, the comparison mechanism may be arranged to derive, if a deviation which exceeds a deviation threshold is detected, an estimate of the distance to a fault giving rise to the deviation, and to generate a fault indication signal indicative of said distance estimate. Hereby is achieved that an operator of the HVDC system may automatically receive an indication of the approximate distance to the detected problem.

The fault detection system may further comprise a trigger device having a connection to the trigger input of the first pulse generation circuit and to the trigger input of the second pulse generation circuit via a trigger output, the trigger device being arranged to generate at least one trigger signal at the trigger output to initiate a fault detection event. The trigger device could for example be arranged so a trigger signal can optionally be sent to one of the first pulse generation circuit and the second pulse generation circuit; to the first pulse generation circuit and the second pulse generation circuit sequentially; or to the first and second pulse generation circuits simultaneously. Hereby is achieved that the fault detection system may be operated in different injection modes: a simultaneous injection mode wherein the attenuation of the signals will be small and wherein the first registered signal pattern will include signals originating from the second electrical pulse and vice versa; and a single signal injection mode, where the first and second signal patterns will include signals originating from the injection of a pulse signal into one line branch 205a or 205b only. By applying both injection modes, further information may be extracted from the registered signal patterns.

The fault detecting system may comprise first and second injection lines wherein a variable inductance is connected in series with the first and second injection lines, respectively. The fault detection system can then for example be arranged so that the variable inductance takes a lower value if the first and second electrical pulses enter the electrode line simultaneously than if the first and second electrical pulses enter the branch line at different points in time; or a higher value of the inductance could be applied in a first fault detection event, and if a suspected fault is detected, the inductance could be reduced and a second fault detection event could be performed in order to better determine the location of the suspected fault.

The pulse generation circuits of the line fault detection system of any one of the above claims may be arranged in a manner so that the amplitude of a generated electrical pulse may be varied. This may be advantageous if an improved resolution of the registered signal pattern is desired.

Further aspects of the invention are set out in the following detailed description and in the accompanying claims.

BRIEF DESCRIPTION OF THE DRAWINGS

FIG. 3a is a schematic illustration of an example of a signal pattern that could be registered in a fault detection system.

FIG. 3b is a schematic illustration of a signal pattern corresponding to that of FIG. 3a, when an electrode line fault has occurred.

FIG. 4 is a schematic illustration of an example of a monitoring device.

FIG. 6 is a schematic illustration of an example of an embodiment of a fault detection system wherein the impedance of the injection lines may be varied.

FIG. 8 is a flowchart schematically illustrating a method of detecting a fault in an electrode line in a HVDC system.

DETAILED DESCRIPTION

Figure 1A:
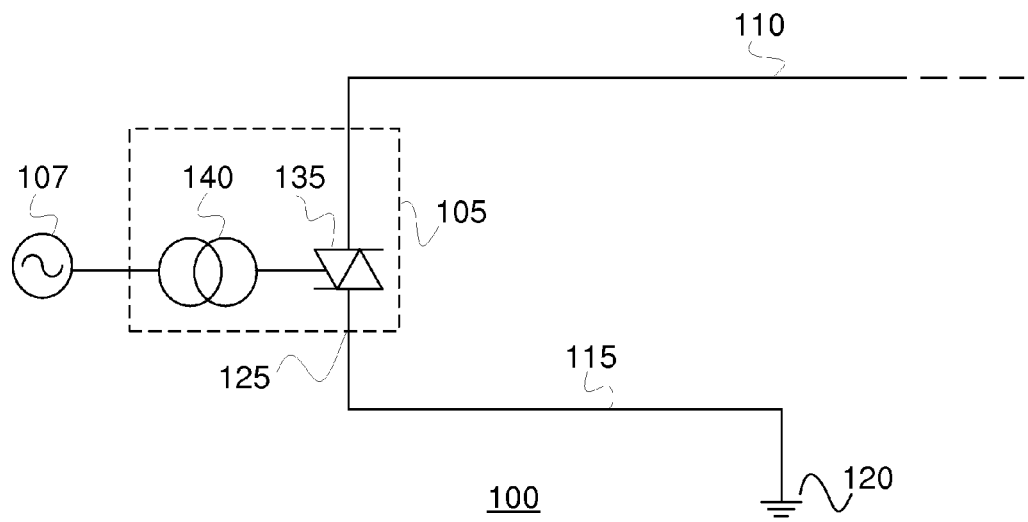
FIG. 1a is a schematic illustration of an example of a monopolar HVDC system.

An example of an HVDC system 100 wherein two HVDC converter stations 105 are connected by means of an HVDC line 110 is schematically illustrated in FIG. 1a. For illustration purposes, only one HVDC converter station 105, or HVDC station 105 for short, is shown in FIG. 1a.

The HVDC station 105 shown in FIG. 1a is connected to an AC power source 107 (an HVDC station 105 of a system 100 is typically connected to an AC power source 107 or an AC network). The HVDC system 100 of FIG. 1a is shown to be a monopolar HVDC system where two grounded electrode lines 115 are used for the return current. Although only one of the electrode lines 115 is shown in FIG. 1a, a similar electrode line 115 is connected to the HVDC station 105 at the other end of HVDC line 110. One end of the electrode lines 115 of system 100 of FIG. 1a is connected to a ground electrode 120, whereas the other end is connected to the DC station neutral 125 of an HVDC station 105. Each HVDC station 105 of the system of FIG. 1a has one HVDC converter 135, and a transformer 145 separating the DC and AC sides of the HVDC system 100. An HVDC system 100 typically includes further equipment which has been left out for sake of clarity.

Figure 1B:
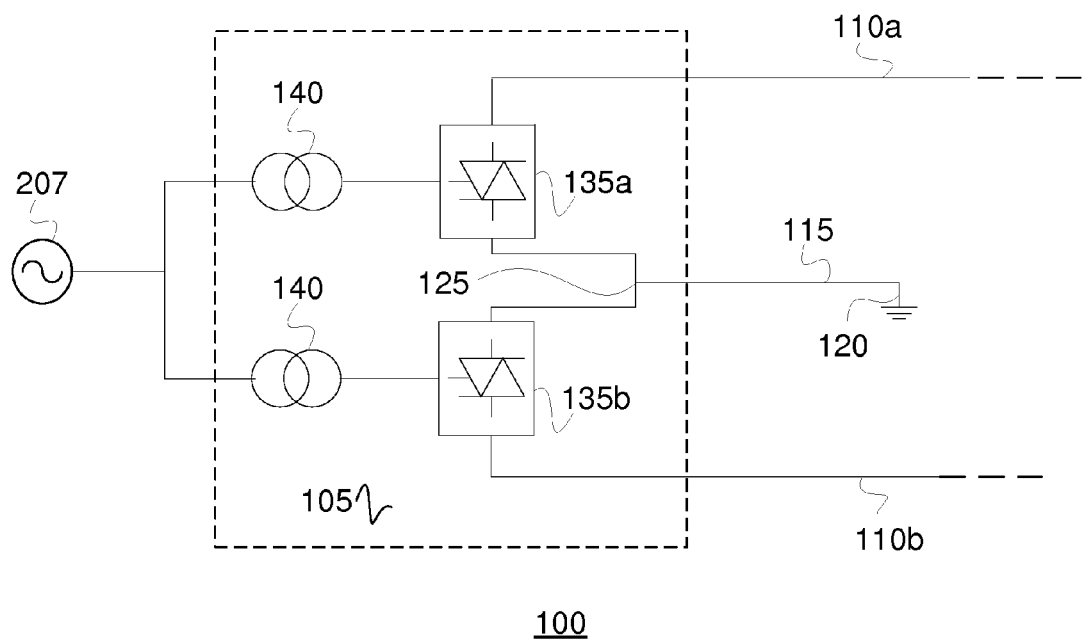
FIG. 1b is a schematic illustration of an example of a bipolar HVDC system.

In FIG. 1b, another example of an HVDC system 100 is schematically illustrated. HVDC system 100 of FIG. 1b is shown to be a bipolar HVDC system, wherein two HVDC lines 110a and 110b are used for carrying the main current between two HVDC stations 105. As in FIG. 1a, only one HVDC station 105 is shown for sake of clarity. An HVDC station 105 of bipolar HVDC system 100 of FIG. 1b comprises two HVDC converters 135a and 135b, arranged to be of different polarity. In a bipolar HVDC system 100, an HVDC station 105 is typically connected to an electrode line 115 via DC station neutral 125. In some configurations (not shown), two bipolar HVDC stations 105 which are connected via two HVDC lines 110a and 110b have a common ground electrode 120, so that the electrode line 115 connected to one of the HVDC stations 105 can be viewed to be extended to the ground electrode 120 of the other HVDC station 105, the electrode line in this configuration often referred to as a metallic return conductor.

During normal operation of a bipolar HVDC system 100, the currents of the HVDC line are balanced, and no current flows in the electrode lines 115. In case of a ground fault in an HVDC line 110a or 110b, the current in an electrode line 115 will be equal to the rated current. In case of outage of the HVDC converter 135a of FIG. 1b, the current in HVDC line 110a will be zero and the magnitude of the current in the electrode line 115 will equal the magnitude of the current in HVDC line 110b. Via the electrode line 115 and the ground electrode 120, the current will be lead to ground in a safe manner. If an HVDC converter 135a or 105b is taken out of operation, the electrode line 115 can be used for the return current and HVDC system 100 of FIG. 1b can still stay in operation.

As mentioned above, faults in electrode lines 115 may remain undetected for a long time unless special measures are taken, since during normal operation of a bipolar HVDC system or at low loads in a monopolar HVDC system, little or no voltage drop occurs over an electrode line 115.

Figure 2:
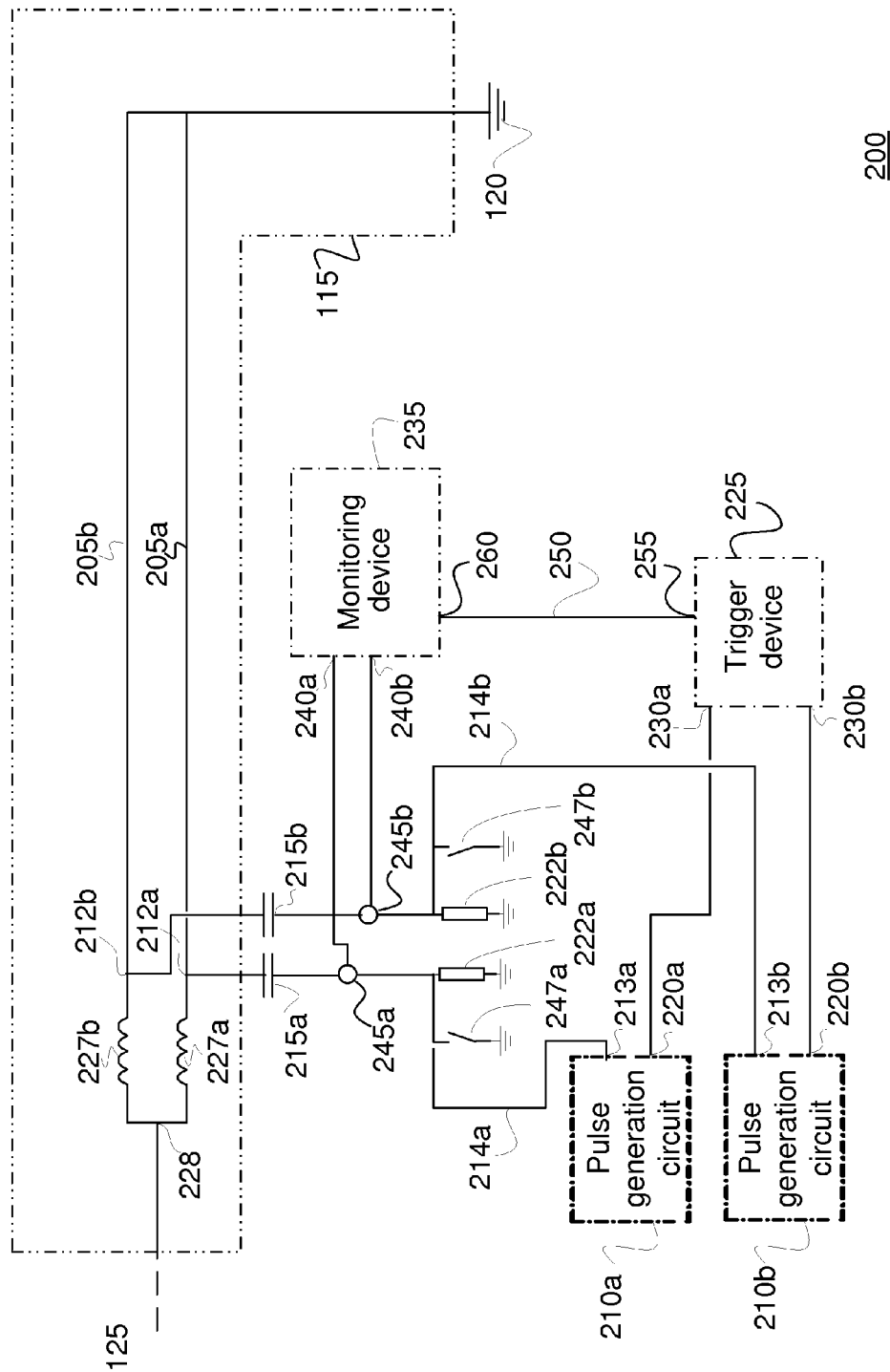
FIG. 2 is a schematic illustration of an example of a fault detection system for detecting faults in an electrode line of an HVDC system.

An example of a fault detection system 200 for detection of line faults on an electrode line 115, comprising first and second branches 205a and 205b, respectively, is shown in FIG. 2.

The first and second branches 205a and 205b of electrode line 115 of FIG. 2 are connected in parallel between DC station neutral 125 of an HVDC station 105, or station neutral 125 for short, and a DC ground electrode 120.

Fault detection system 200 of FIG. 2 comprises first and second pulse generation circuits 210a and 210b, respectively. An output 213a of first pulse generation circuit 210b is connected to first branch 205a at an entry point 212a via an injection line 214a having a series-connected injection capacitor 215a. An output 213b of second pulse generation circuit 210b is connected to second branch 205b at an entry point 212b via an injection line 214b having a series connected injection capacitor 215b. Injection capacitors 215a and 215b serve to protect the fault detection system 200 from any strong DC currents in electrode line 115, due for example to the strike of lightning, a pole outage in an HVDC station 105 to which electrode line 115 is connected, etc. The distance between the entry point 212a and the ground electrode 120 could advantageously be the same as the distance between the entry point 212b and the ground electrode 120, so that the time required for a pulse to travel from an entry point 212 to the ground electrode 120 will be the same for both branches.

First pulse generation circuit 210a is arranged to generate, upon receipt of a trigger signal at an input 220a, an electrical pulse at output 213a. Second pulse generation circuit 210b is arranged to generate, upon receipt of a trigger signal at an input 220b, a complementary electrical pulse at output 213b of opposite polarity to the pulse generated by the first pulse generation circuit 210a. A trigger signal could for example be an electrical signal generated by a trigger device as described below; a signal manually provided to the pulse generation circuit via a trigger input e.g. trigger input 220a/b in the form of a button or a lever; etc.

Fault detection system 200 of FIG. 2 are shown to include resistor 222a and 222b, where a resistor 222a (222b) is connected between earth and point on the injection line 214a (214b) between the pulse generation circuit 210a (210b) and the injection capacitor 215a (215b). The resistors 222a and 222b serve to discharge the injection capacitors 215a and 215b, respectively, when an electrical pulse has been injected into branch lines 205a or 205b, respectively. Electrical pulses of single polarity can repeatedly be transmitted via the injection capacitors 215a and 215b, the resistors 222a and 222b allowing the injection capacitors 215a and 215b, respectively, to discharge between pulses.

At the station neutral end of a branch 205a/b, it would be advantageous to apply a line trap 227a/b in order to adapt the line impedance at this end so that most of the pulse signals injected into electrode line branches 205a and 205b are transmitted through the electrode line 115, rather than transmitted through to the HVDC station 105. The line trap 227 could for example be a reactor where the inductance of the reactor has been selected so that the impedance for a pulse will be high compared to the surge impedance of the electrode line 115.

Fault detection system 200 further comprises a trigger device 225, which is arranged to generate a trigger signal at certain instances, such as for example at certain time intervals; upon suspicion of an electrode line fault; upon receipt of an instruction to do so via a user interface; or at other suitable instances. An output 230a of trigger device 225 is connected to the input 220a of pulse generation circuit 210a, and an output 230b is connected to the input 220b of pulse generation circuit 210b. Outputs 230a and 230b may or may not be implemented as the same output. Trigger device 225 could for example be arranged so that it could be manually operated via control devices (e.g. buttons or levers) connected to a circuit generating a trigger signal, and/or the circuit generating a trigger signal could be operated by a computerized control system.

In one embodiment, trigger device 225 is arranged to operate in different modes of operation: A first mode of operation wherein trigger signals are simultaneously generated at both outputs 230a and 230b, and a second mode of operation wherein a trigger signal is generated at one of the outputs 230a and 230b at a time. In the simultaneous mode of operation, electrical pulses of opposite polarity will enter first and second branches 205a and 205b at the same time. First and second branches 205a and 205b are typically located in the vicinity of each other. By sending complementary electrical pulses of opposite polarity into the two branches at the same time, practically no current will be induced in the surrounding (typically the earth), and the attenuation of the signals will therefore be smaller than if an electrical pulse was generated in one branch line 205 at a time. As the two complementary pulses reach the ground electrode 120 at the same time if the distances from entry point 212a to the ground electrode 120 is approximately the same as from entry point 212b, there will be no or negligible interaction between the ground electrode 120 and the signal pulses in this mode of operation. Thus, any reflection of an earth mode at the ground electrode 120 will be negligible in this mode of operation, even if no adaptation circuit to adapt the impedance of the electrode line 115 is provided at the ground electrode end of electrode line 115.

However, as will be further discussed below, it can be advantageous to send electrical pulse signals into one branch line 205/205b at a time, for example in case of a suspected electrode line fault. Hence, in one mode of operation, trigger device 225 generates a trigger signal at one output 230a and 230b at a time. Trigger device 225 could be arranged to generate, in this mode of operation, two independent trigger signals at the output 230a and 230b at different points in time. The time between two different trigger signals could for example exceed 20 times the pulse runtime to the ground electrode 120—the pulse runtime being approximately 33 μs per 10 km—in order to avoid interference of the electrical pulses generated in response to different trigger signals. Oftentimes, it will be desirable to operate the trigger device 225 in both modes of operation upon each fault detection event, in order to obtain a greater information content in the data collected upon a fault detection event.

A monitoring device 235 is furthermore provided in fault detection system 200, the monitoring device being arranged to register electrical pulses in one or both of the injection lines 214a and 214b. Inputs 240a and 240b of monitoring device 235 are connected to current measurement devices 245a and 245b, respectively, the current measurement devices arranged at injection lines 214a and 214b, respectively, in order to detect electrical pulses in the injection lines 214a and 214b. A current measurement device 245 could for example be a current transformer or another type of current transducer, such as a Rogowsky coil. In an alternative embodiment, a current measurement device 245a (245b) could be arranged directly on the corresponding branch line 205a (205b) between the entry point 212a (212b) and the ground electrode 120, preferably in the vicinity of the entry point 212a (212b). In the following, a signal detected by a current measurement device 245a/b will be referred to as a signal occurring in the corresponding branch line 214a/b, regardless of whether the current measurement device actually is located to measure the current in the injection line 214a/b, or the current in the corresponding branch line 205a/b.

The branch lines 214 and 214b are shown to be connectable to earth via earthing switches 247a and 247b, respectively, which are connected in parallel to the resistors 233a and 233b, respectively. If one electrical pulse is generated at a time, for example onto branch line 205a (205b), it might be advantageous to close the earthing switch 247b (247a) on the injection line 214b (214a) connected to the other branch line 205b (205a), in order to allow for an improved detection of the pulses on the injection line 214b (214a) when the pulse generation circuit 210b (210a) is not currently in use. The earthing switches 247a and 247b could for example be controlled by the trigger device 225, so that a signal actuating the connection of the earthing switch 247b is sent to the earthing switch 247b upon (or shortly before) sending a trigger signal to the pulse generation circuit 213a (213b) only.

An earthing switch 247a (247b) could also be used to connect the injection line 214a (214b) to earth if the corresponding pulse generation circuit 210a (210b) is disconnected for e.g. maintenance, in order to allow for continued operation of the corresponding branch line 205a (205b) while the pulse generation circuit 210a (210b) is disconnected.

In each fault detection event, monitoring device 235 in the arrangement of FIG. 2 can, via current measurement device 245a (245b), register an electrical pulse generated by the pulse generation circuit 210a (210b) upon entering the electrode line 115. Furthermore, monitoring device 235a (235b) can also register echo pulses due to reflection of the electrical pulse at any discontinuities of the electrode line 115. Current measurement device 245a (245b) can typically also detect pulses deriving from an electrical pulse generated by pulse generation circuit 210b (210a). The different pulses detected by a current measurement device 245a/b upon a fault detection event form a detected signal pattern.

A trigger connection 250 can advantageously be arranged between an output 255 of the trigger device 225 and an input 260 of the monitoring device 235. The trigger connection 250 can for example be used by the trigger device 225 for alerting the monitoring device that a trigger signal has been sent to one or both pulse generation circuits 220, so that the monitoring device 235 should activate monitoring of signals received from the current measurement device(s) 245a and/or 245b. Trigger device 225 could for example be arranged to generate one of three different types of alerting signals on output 255, depending on whether the monitoring device 235 should be alerted to monitor the output from current measurement device 245a, 245b or both. Alternatively, only one type of trigger signal can be used.

In one implementation of fault detection system 200, only one pulse generation circuit, arranged to generate two complementary pulses, is provided.

An example of a signal pattern detected by a current measurement device 245a/b under normal operation is shown in the schematic diagram of FIG. 3a, wherein registered signal intensity (I) is plotted vs. time (t). At a point in time t0, the injected electrical pulse is registered. At t1 and t2, different stray signals are detected, which are echo signals originating e.g. from the presence of a large metallic object in the vicinity of the branch line 205a/205b; a discontinuity on the electrode line 115, etc. At time t3, a reflection pulse originating from the ground electrode 120 is detected.

In FIG. 3b, a corresponding signal pattern detected by the current measurement device 245a/b in case of an earth fault in the electrode line 115 is shown. At time ti, a signal is received at the current measurement device 245a/b, the signal corresponding to a reflection at the earth fault. Hence, the occurrence of a peak in a detected signal pattern, which is not present in the signal pattern detected during normal operation, indicates that an earth fault may be present on one of the branch lines 205a or 205b.

Since the transmission speed of the electrical pulse in the conductors forming the electrode line 115 and the injection lines 214 is known, the location of the fault may be derived from the time difference ti–t0 (cf. FIG. 3b), this time difference representing the time required for the pulse signal to travel twice the distance from the measurement device 245 to the earth fault causing the reflection.

By allowing for separate pulse detection at the two injection lines 214a and 214b, electrical pulse signals occurring in any one of the two branch lines 205a and 205b can be independently registered.

The signal patterns obtained from detection of pulse signals injected into the branch lines 205a and 205b and their echo signals are often difficult to interpret. By registering the electrical pulse signals in the two branch lines 205a and 205b separately, an improved analysis of the registered electrical pulse signals can be achieved. In the following, a signal pattern detected by current measurement device 245a will be denoted A, whereas a signal pattern detected by current measurement device 245b will be denoted B. When two complementary signals are simultaneously injected in at the entry points 112a and 112b, respectively, the signals will travel in pole mode, i.e. a mode where the injected signal pulses travel between the two branch lines 205a and 205b and a negligible part of the signal travels via earth. When separately detecting the two signal patterns A and B, representations of other transmission modes can be arrived at by signal analysis, as discussed below.

The two signal patterns A and B could be subtracted to arrive at a signal pattern representing a pole mode of the injected signals. If the two detected signal patterns A and B are added, on the other hand, a signal pattern representing an earth mode of the injected signals could be arrived at, i.e. a mode where the injected signals travel in common mode through the line with earth as the return conductor. Furthermore, the detected signal patterns A and B could be separately analyzed, each representing a combination of pole mode and earth mode. Hence, if complementary pulses are injected simultaneously, the following analysis modes could be obtained:

A–B: pole mode
A+B: earth mode
A: combined mode A
B: combined mode B

In the following, the term "registered signal pattern" will be used to refer to any combination of detected signal patterns A and B, such as for example A, B, A–B and A+B.

In many situations, for example in case of an earth fault of high resistance, a reflection from the earth fault will typically be more easily discernible in earth mode than in pole mode. In other situations, for example in case of a short circuit between the branch lines 205a and 205b, or if both branch lines 205a and 205b are broken, a reflection from the fault will typically be more easily discernible in the pole mode signal. In yet other situations, for example if branch line 205a is broken while branch line 205b remains undamaged, the fault might be more easily discernible in combined mode A and vice versa. By transmitting the electrical pulse signals in pole mode with opposite polarity, the signals will experience lower attenuation than if transmitted in earth mode. By detecting the two signals separately, the earth mode may be derived from the pole mode measurements as described above, and an improved accuracy of the analysis may be achieved.

Furthermore, by providing separate injecting circuits 210a and 210b, whereby pulse signals may be separately injected in branch lines 205a and 205b, electrical pulses may be injected into the two branch lines 205a/b one at a time. A pulse signal can for example be transmitted into injection line 214a/b and detected by both current measurement devices 245a and/or 245b at a first point in time, and a pulse signal can be transmitted into the other injection line 214b/a and detected by the current measurement devices 245b and/or 245a at a different point in time.

When providing separate pulse generation circuits 210a and 210b, three different modes of injection of signals into branch lines 205a and 205b may be defined:

1. Simultaneous injection, whereby two complementary signals simultaneously are injected into branch lines 205a and 205b;
2. Single signal injection into branch line 205a; and
3. Single signal injection into branch line 205b.

When a single signal is injected into branch line 205a/b, no signals originating from a pulse injection into the other injection line will appear in the detected signal patterns A and B. Thus, further information may be achieved by injecting the pulses separately as well as simultaneously. For example, since a combination of pole mode and earth mode is injected in the single signal case, the earth mode signal will typically be relatively stronger than if the earth mode is derived from measurements on two complementary signals. On the other hand, a separately injected single signal will be more attenuated than if two complementary pulses are simultaneously transmitted. This could be compensated for, if desired, as is further discussed below. The two single signal injection modes could be combined to form a sequential injection mode, wherein single signals are sequentially injected into the different branch lines 205a and 205b, respectively.

By performing measurements of signal patterns A and B on both separately injected single signals and simultaneously injected complementary signals, yet further information may be collected, and the accuracy of the fault analysis may be improved. A registered signal pattern A obtained from a single signal injected into branch line 205a can be added to, or subtracted from, a registered signal pattern B obtained from a single signal injected into branch line 205a, in a manner described above in relation to simultaneous measurements. In fact, at least 12 different relevant registered signal patterns may be derived from the 4 different analyses modes and the 3 different injection modes. Yet further signal patterns may give even further information—for example, a signal pattern A obtained from injecting a single signal into branch line 205a could be added to, or subtracted from, a signal pattern B obtained from injecting a single signal into branch line 205b in order to obtain a further signal pattern, and vice versa.

An example of a monitoring device 235 is schematically shown in FIG. 4. Monitoring device 235 includes a signal pattern register 400 for registering signal patterns detected by current measurement devices 245a and/or 245b. Monitoring device 235 could advantageously also include a sample register 405, wherein samples of signal patterns to be expected in different measurement circumstances are stored, and a comparison mechanism 410 capable of comparing registered signal patterns to sample signal patterns.

Signal register 400 of monitoring device 235 is arranged so that it can receive two independent signal patterns per fault detection event via current measurement devices 245a and 245b, respectively. As shown in FIG. 4, input 260, on which alerting signals from trigger device 225 can be received, can be connected to signal register 400 in order to alert signal register 400 that the output from current measurement device 245a and/or 245b should be registered. Alternatively, or additionally, input 260 could be connected to comparison mechanism 410, which could then be arranged to alert signal register 400 upon receipt of an alerting signal from input 260 is signal register 400 is not directly connected to input 260. A connection 415 between signal register 400 and comparison mechanism 410 could be used for transferring detected signal patterns from the signal register 400 to comparison mechanism 410. A connection 420 between sample register 405 and comparison mechanism 410 could be used by comparison mechanism 410 for retrieving sample signal patterns from the sample register 405. A connection 425 between signal register 400 and sample register 405 could be used to update the sample register 405 with signal patterns registered by signal register 400. If desired, one of connections 415, 420 and 425 could be omitted, and communication between the two entities which would then lack a direct connection could be performed via the third entity.

Examples of scenarios for which sample signal patterns could be stored in sample register 405 are: a normal operation scenario; a normal operation scenario with normal disturbances which occur intermittently; an earth fault scenario in one or both of branches 215a and 215b; a short circuit scenario; a scenario wherein one or both of the branch lines 215a/b are broken, etc. For each relevant scenario, one or more sample signal patterns could be stored out of the at least 12 different sample signal patterns obtainable from the 4 different analysis modes and the 3 different injection modes. The more different sample signal patterns are stored for each scenario, the better is the analysis of a registered signal sample that can be made.

As already mentioned, monitoring device 235 could advantageously include a comparison mechanism 410, arranged to compare at least one registered signal pattern to one or more of the sample signal patterns. Comparison mechanism 410 could further be arranged to generate a fault indication signal on output 428 to a user interface 430 when a fault is suspected, for example if the ratio of the intensity of the registered signal pattern to the expected signal pattern during normal operation deviates from unity by a predetermined amount at one or more points in time (zero time could for example be defined at the point in time where the injected signal is registered, cf. time t0 in FIGS. 3a-d). Comparison mechanism 410 could furthermore be arranged to compare, for example when a fault is suspected, a registered signal pattern to sample signal patterns representing different fault scenarios, in order to determine the nature of the suspected fault. In order to improve the comparison result, the monitoring device 235 could be arranged to update the relevant sample signal pattern in sample register 405 when measurements of a fault detection event has been performed, so that the sample signal patterns are continuously improved and adapted to current operational conditions. This could be particularly useful in relation to the sample signal pattern representing normal operation.

Comparison mechanism 410 could, in one implementation, be arranged so that it could send a trigger signal to trigger device 225 via connection 250, if desired. Since other reasons than an earth fault can cause a temporary deviation of a registered signal pattern from the expected signal pattern, such as for example the temporary presence of a large metallic object such as a large train, etc, it might be advantageous for the comparison mechanism 410 to be able to instruct the trigger device 225 to repeat the initiation of a fault detection event when a suspect signal pattern has been registered, in order to ensure that any deviation from the expected signal pattern is not caused by a temporary disturbance. In one implementation, a fault detection event is initiated by a simultaneous transmission of complementary pulses, and if any deviation from the expected measurement results is obtained, then single transmissions of electrical pulses will be initiated, while if no deviation is detected, no single transmission measurements will be performed.

Monitoring device 235 of FIG. 4 is furthermore connected to a user interface 430, for example via comparison mechanism 410. The user interface 430 is used to indicate any detected deviation of the registered signal patterns from the expected signal patterns. Furthermore, the user interface 430 could be arranged to allow for an operator of fault detection system 200 to perform further analysis of the registered signal patterns or to view the analysis performed by comparison mechanism 410. If desired, the user interface 430 could furthermore be connected to trigger device 225, for example via connection 250, in a manner so that the trigger device can be operated via the user interface 430.

The user interface 430 could, if desired, be included in the same physical entity as monitoring device 235. In FIG. 4, comparison mechanism 410, the signal register 400 and the sample register 405 are shown to be implemented in the same physical entity. However, this does not have to be the case. For example, comparison mechanism 410 could be separate to the signal register 400 and/or the sample register 405, and could for example be located in the same physical entity as the user interface 430. Moreover, user interface 430 could be part of the same physical entity as the.

In one embodiment of fault detection system 200, the fault detection system is used for localization of line faults, as well as for detection of line faults. When a line fault has been detected as a discrepancy in a registered signal pattern from the corresponding sample signal pattern corresponding to normal operation, the registered signal pattern could be analyzed in order to determine a time interval between the transmission of the generated electrical pulse and the receipt of a feature in the received signal pattern corresponding to a reflection at the line fault. From this time interval, the location of the line fault may be determined, as discussed in relation to FIG. 3b. The comparison mechanism 410 could for example be arranged to perform such analysis, or a separate fault location mechanism could be introduced.

Figure 5:
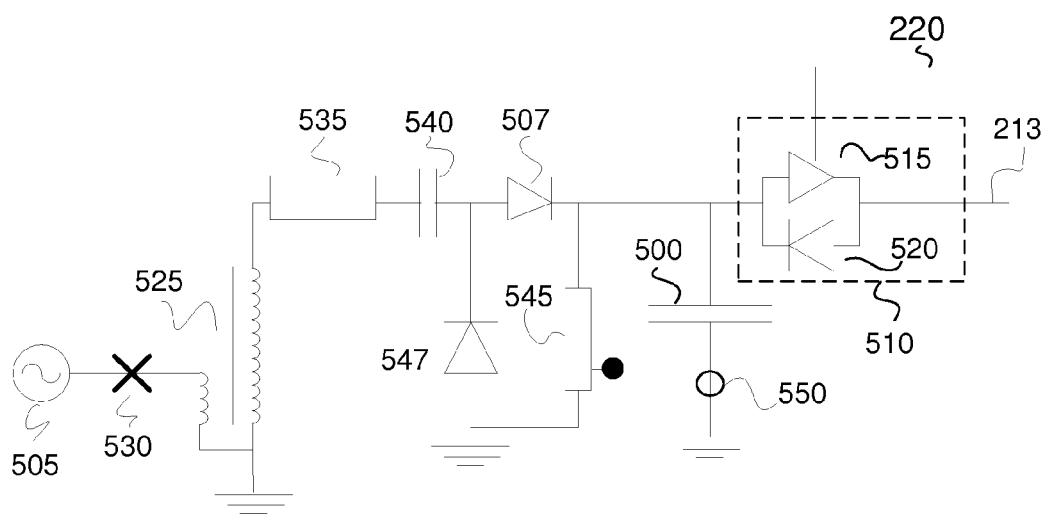
FIG. 5 is an illustration of an example of a pulse generation circuit arranged to generate an electrical pulse.

An example of a pulse generation circuit 210a/b for generation of an electrical pulse to be injected into a branch line 205a/b is shown in FIG. 5. The pulse generation circuit 210a/b of FIG. 5 comprises a capacitor 500 connected to earth at one end, and to a power source 505 via a diode 507 at the other end. The capacitor 500 can thus be charged from the power source 505. The power source 505 could for example be external to the HVDC system 100. The pulse generation circuit 210 further comprises an electronic switch 510, one end of which is connected to output 213, and the other end being connected to the power source end of capacitor 500. Electronic switch 510 is connected to trigger signal input 220. Upon firing of the electronic switch 510 when pulse generation circuit 210a/b is connected to a branch line 205a/b, a pulse will be injected into the branch line 205a/b if the capacitor 500 is charged. The electronic switch 510 could for example include a thyristor 515 and a diode 520 connected in anti-parallel as shown in FIG. 5; or series connected IGBTs, or any other suitable electronic components. Other switches, or spark caps, could alternatively be used instead of electronic switch 510, such as for example a mechanical switch.

The power source 505 used to charge capacitor 500 could for example be a low voltage auxiliary power supply. A voltage transformer 525 could be used between the power source 505 and the capacitor 500 in order to generate a higher voltage at the capacitor 500, for example in the order of 50-100 kV. One end of such voltage transformer 525 could advantageously be connected to earth. A circuit switch 530 could be included between the power source 505 and the voltage transformer 525, by means of which the power source 505 could be disconnected when the capacitor 500 has been charged, or when idle. A resistor 535 could be provided between the voltage transformer and the capacitor 500, in order to limit the inrush current upon charging, and a series capacitor 540 could be provided between the power source 505 and the diode 507 in order to prevent DC saturation of the voltage transformer 525. A resistive voltage divider 545, or other voltage measurement device, could be connected in parallel with the capacitor 500 for voltage measurement purposes. A diode 547 is connected between earth and a point between capacitor 540 and diode 507 in order to recharge capacitor 540. The pulse generation circuit of FIG. 5 could also include a current measurement device 550 (e.g. a current transformer), which could be used for measuring the pulse in order to provide an alternative or complementary current measurement of the injected pulse to that provided by current measurement device 245a/b of FIG. 2.

The pulse generation circuit 210 of FIG. 5 is arranged to generate a pulse of a positive polarity. In order to generate a complementary pulse of negative polarity, the thyristor 515 and the diodes 520, 507 and 547 would have to be connected in the opposite direction way. Hence, in order to provide the first and second pulse generation circuits 210a and 210b, one pulse generation circuit 210 as shown in FIG. 5, and one pulse generation circuit wherein the thyristor 515 and diodes 520, 507 and 547 have been connected in the opposite direction, can be provided, The pulse generation circuit 210 could be altered in many ways. For example, the capacitor 500 could be charged via a Greatz bridge. Full insulation could then advantageously be provided on both sides of the transformer 525. Moreover, the transformer 525 may be replaced by an electronic transformer. A DC to AC converter may also be used. Other types of pulse generation circuit 210 could alternatively be used. Since there are no components at the output side of the pulse generation circuits 210 in fault detection system 200 which will suffer from saturation if the generated electrical pulse includes a DC component, no harm is done if the shape of the complementary pulses generated by the two pulse generation circuits 210a and 210b differ slightly. Hence, the design of the pulse generation circuits 210 can be kept simple.

Furthermore, the electrical pulse generated by pulse generation circuit 210 could take a number of different shapes. Since no components at the output side are required that will suffer from saturation if the generated electrical pulse includes a DC component, each pulse generation circuit 210 can be adapted to generate an electrical pulse of a single polarity, if desired. Generally, a pulse generation circuit 210a/b arranged to generate a single polarity pulse can be kept simpler than if a pulse of both polarities is to be generated. However, the above described fault detection system 200 could also operate with pulse generation circuits 210a/b arranged to generate electrical pulses of both polarities.

In some circumstances, it may be desired to generate signal pulses of different duration. For example, if a single signal pulse is injected into one of branch lines 205a and 205b at a time, the duration of the pulse could advantageously be longer than if complementary pulses are simultaneously injected, since the attenuation of a single pulse will be considerably larger. One way of facilitating for varying of the duration of the injected pulse is to provide a series connected reactor of inductance which can be varied in injection lines 214a and 214b, respectively. Injection lines 214a and 214b comprising series connected reactors 600a and 600b of variable inductance are shown in FIG. 6. By increasing the inductance 600a/b, the duration of a pulse generated by the pulse generation circuit 210a/b will be increased, and vice versa. The mechanism of inductance 600a/b by which an inductance 600a/b may be varied could in one implementation be arranged to receive a signal from trigger device 225 via trigger device output 605, in response to which the inductance of reactor 600a/b will be varied. Such mechanism for varying the inductance could for example be a switch used to connect or disconnect an inductance from the injection line 214a/b, or switches for connection/disconnection of further reactors or turns in series. In an implementation where a variable inductance 600a/b is provided, trigger device 225 could be arranged to send a signal to inductance 600a/b indicative of whether a large inductance, or a smaller inductance is required. The mechanism of reactor 600a/b could, if desired, furthermore be arranged to be controlled via a user interface 610, which could for example be the same user interface as user interface 430. A low value of the inductance yields a sharper pulse, facilitating a more precise location of the fault. A larger value of the inductance results in a wider pulse which experiences less attenuation, especially for the earth mode component, resulting in a more reliable detection of remote faults, but with reduced precision regarding location of the fault. In one implementation, the initially transmitted pulses are transmitted with a higher value of the inductance 600a/b. If a suspected fault is detected, the inductance 600a/b is reduced, so that the location of the fault can be more precisely determined. By initially performing the measurements on a wider pulse, the approximate location of the fault can be determined, and the corresponding part of the signal pattern(s) obtained from a sharper pulse can then be selected for a closer examination—the poor resolution of the sharper pulse will be less of a problem once the approximate location of a fault has been determined.

Figure 7A:
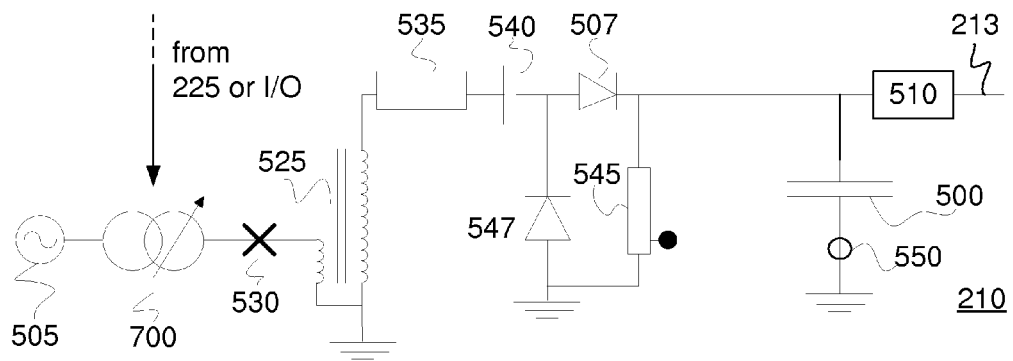
FIG. 7a-c are illustrations of different embodiments of a pulse generation circuit wherein the amplitude of the generated electrical pulse may be varied.
Figure 7B:
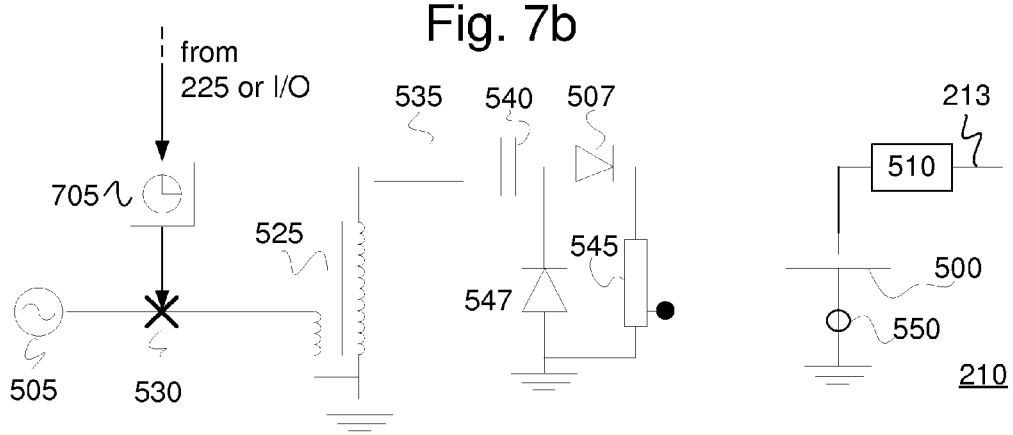
Figure 7C:
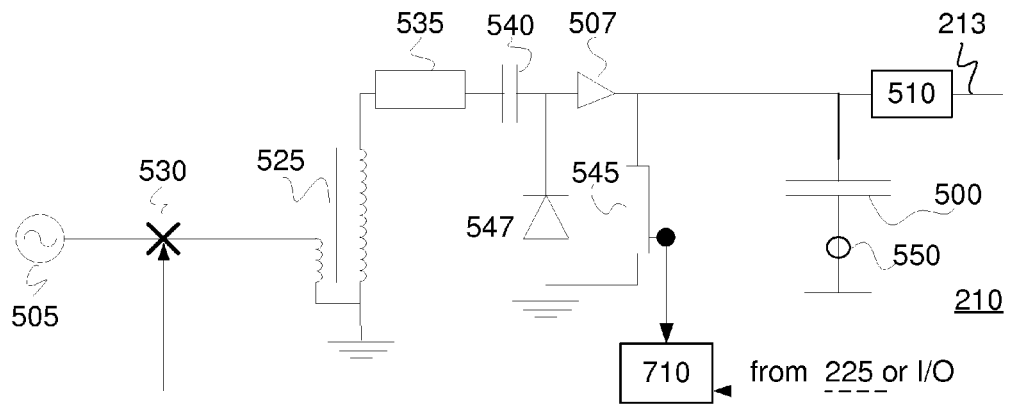

If a variable inductance 600a/b is provided in an injection line 214a/b, it might be desired to allow for the generation of electrical pulses of different amplitudes, so that an electrical pulse of higher amplitude can be generated when the inductance of the variable inductance 600a/b is higher. A possibility to vary the amplitude of the generated electrical pulse may also be useful in implementations where the impedance of the injection lines 214a and 214b is constant, such as if a weak deviation from the expected signal pattern appears in a registered signal pattern, in which case an increased amplitude of the electrical pulse may improve the resolution. In the example of a pulse generation circuit 210 shown in FIG. 5, a possibility to generate electrical pulse signals of different amplitude could for example be achieved by including a transformer 700 with variable turn ratio in series with the power source 505 and the circuit switch 530 of FIG. 5. Such an implementation is shown in FIG. 7a, where a transformer 700 having a variable turn ratio is connected between a power source 505 and a circuit switch 530. Alternatively, the circuit switch 530 could be arranged to disconnect the power source 505 from the capacitor 500 upon charging of the capacitor 500 when the voltage over the capacitor 500 has reached a desired level. This could for example be achieved by connecting a timer 705 to an actuator of circuit switch 530, which timer could for example be controlled by a signal sent from trigger device 225 (cf. output 605 in FIG. 6), and/or via a user interface. Such an implementation is shown in FIG. 7b. An alternative way of controlling the circuit switch 530 could be to provide, to an actuator of circuit switch 530, a signal indicating that the circuit switch 530 should be disconnected, at the time when the voltage over the capacitor 500 has reached a desired level. An example of such an implementation is illustrated in FIG. 7c, wherein a voltage measurement device 545, for example a resistive voltage divider, is arranged to measure the voltage across the capacitor 500. Voltage measurement device 545 of FIG. 7c is arranged to convey an output signal, indicative of the measured voltage, to a voltage threshold mechanism 710, which is arranged to compare the measured voltage to a voltage threshold. Voltage threshold mechanism 710 is further arranged to send a signal to circuit switch 530 when the measured voltage has reached the voltage threshold. The voltage threshold mechanism 710 could be arranged so that the value of the voltage threshold could be controlled by a signal sent from trigger device 225, and/or via a user interface.

The voltage measurement device 710 could for example be arranged to that the threshold value could be controlled by a signal sent from trigger device 225, and/or via a user interface.

A method of detecting faults in an electrode line of an HVDC system 200 by means of fault detection system 200 is schematically illustrated in FIG. 8. In step 800, a trigger signal is given to two pulse generation circuits 210a and 210b. As described above, the trigger signal could be given to the two pulse generation circuits simultaneously, or in a sequential manner. Upon receipt of a trigger signal, each of the pulse generation circuits 210a and 210b will in step 805 generate an electrical pulse on its output 213a and 213b, respectively, which electrical pulses will be fed into branch lines 205a and 205b, respectively. In step 810, two different signal patterns A and B will be detected, where signal pattern A includes the electrical pulse signal fed into branch line 205a, as well as any echo signals occurring on branch line 205a, and signal pattern B includes corresponding signals occurring on branch line 205b. In step 815, further signal patterns are derived from the detected signal patterns: for example a signal pattern A+B and a signal pattern A−B. The detected signal patterns A and B, as well as the further signal patterns derived from A and B, are in the above description referred to as registered signal patterns. In step 825, at least one registered signal pattern is compared to at least one sample signal pattern, and it is checked whether any deviation from the expected signal pattern exceeds an acceptable deviation. If so, step 830 is entered, wherein an indication indicating a deviation from the normal behaviour is generated. The procedure is then ended in step 835. If no unacceptable deviation is found in step 825, then step 835 is entered without first entering step 830.

If the fault detection system 200 is used for fault localisation as well as fault detection, an additional step including localisation of the fault, as described above, could be inserted after step 825.

Steps 800-815 could be performed both for simultaneous transmission and sequential transmission of the electrical pulses prior to entering step 825. Alternatively, steps 800-825 could be performed for one injection mode, for example the simultaneous transmission of complementary pulses, and if a deviation is found in step 825, steps 800-825 could be performed also for another injection mode (e.g. a single signal injection on 214a or 214b, or sequential injection on 214a and 214b). Step 830 could then be entered when step 825 has been performed for all relevant injection modes. However, in one implementation, only one injection mode will ever be used.

The method of FIG. 8 could for example be altered in that the electrical pulses fed into the branch lines 205a and 205b, respectively, are both generated by the same pulse generation circuit 210, so that the trigger signal of step 800 is only sent to one pulse generation circuit.

Figure 9:
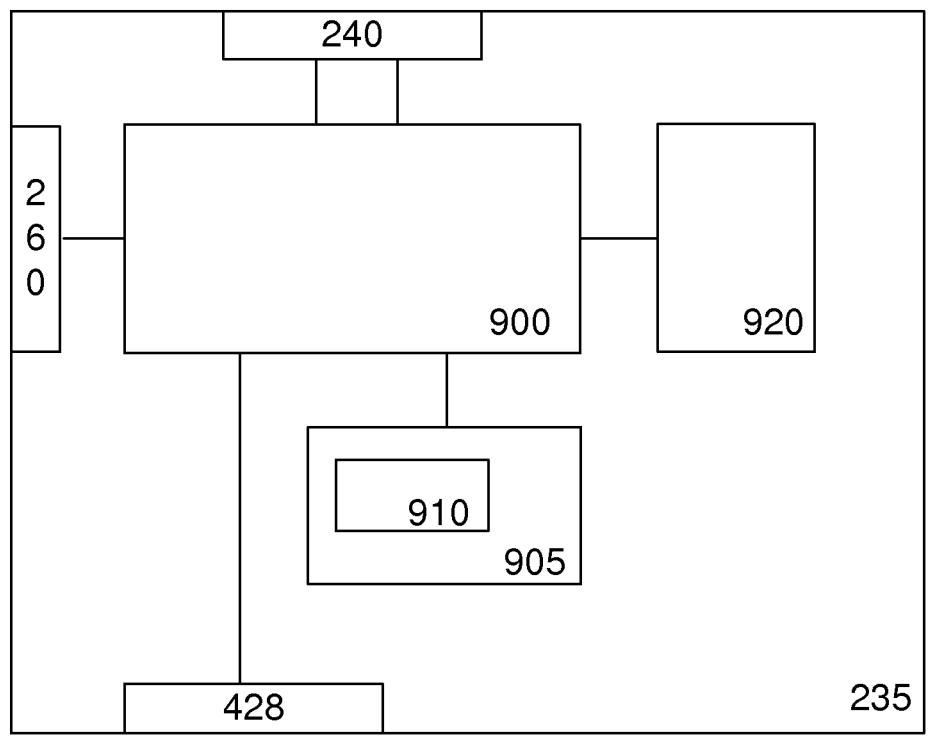
FIG. 9 is an alternative way of schematically illustrating an example of a monitoring device.

Steps 815-830 of FIG. 8 could advantageously be performed in monitoring device 235. Monitoring device could for example be implemented by means of a suitable combination of hardware and software. In FIG. 9, an alternative way of schematically illustrating the monitoring device 235 of FIG. 4 is shown. FIG. 9 shows the monitoring device 235 comprising processing means 900 connected to a computer program product 905 in the form of a memory, as well as to interfaces 240, 260, 428, and to memory 920 for storing signal patterns. The computer program product 905 comprises computer readable code means that stores a computer program 910, which when executed by the processing means 900 causes the monitoring device 235 to perform steps 815-830 of FIG. 8. In other words, the monitoring device 235 and its comparison mechanism 410 may in this embodiment be implemented with the help of corresponding program modules of the computer program 910. In the shown embodiment, the monitoring device 235 comprises a memory 920 for storing registered signal patterns, as well as sample signal patterns. Memory 920 could be implemented as part of memory 905, if desired. The processing means 900 could be one or more processors—for example, one processor of processing means 900 could be arranged to execute code relating to registering of signal patterns from current measurement devices 245a and 245b, and another processor could be arranged to execute code relating to the comparison mechanism 410; or the same processor could be used for these purposes. The memories 905 and 920 could be any type of non-volatile computer readable means, such as a hard drive, a flash memory, an EEPROM (electrically erasable programmable read-only memory) a DVD disc, a CD disc, a USB memory, etc.

Any connections between different entities in fault detection system 200 which are used for signalling within the fault detection system 200 could be wired connections, or wireless connections, such as for example radio connections (e.g. Bluetooth), infrared connections etc.

The fault detection method and system 200 described above are applicable to any type of HVDC system 100 having at least one electrode line 115, such as a monopolar HVDC system 100, a bipolar HVDC system 100, an HVDC system 100 comprising a network of HVDC stations 105, etc. The above description has been made in terms of an electrode line having two branch lines. The above described technology could also be applied to an electrode line having more than two branch lines, in which case the line fault detection system would be arranged to independently detect signal patterns from each of the branch lines. Some aspects of the above described technology, such as the variable inductance in order to alter the width of a generated electrical pulse discussed in relation to FIG. 6, as well as the different arrangements for generating electrical pulses of varying amplitude, are applicable also to fault detection systems for detecting faults in lines or cables having one branch line only.

Although various aspects of the invention are set out in the accompanying independent claims, other aspects of the invention include the combination of any features presented in the above description and/or in the accompanying claims, and not solely the combinations explicitly set out in the accompanying claims.

One skilled in the art will appreciate that the technology presented herein is not limited to the embodiments disclosed in the accompanying drawings and the foregoing detailed description, which are presented for purposes of illustration only, but it can be implemented in a number of different ways, and it is defined by the following claims.

The invention claimed is:

1. A fault detection system for detection of line faults on an electrode line in an HVDC system, wherein the electrode line comprises a first and second branch connected in parallel, the line fault detecting system comprising:
   a first pulse generation circuit having a trigger input and an output connectable to the first branch via a first injection line, the first pulse generation circuit arranged to generate a first electrical pulse at the output upon receipt of a first trigger signal;
   a second pulse generation circuit having a trigger input and an output connectable to the second branch via a second injection line, the second pulse generation circuit arranged to generate a second electrical pulse of opposite polarity to the first electrical pulse at the output upon receipt of a second trigger signal;
   a first current measuring device arranged to generate a signal indicative of electrical signals occurring in the first branch line;
   a second current measuring device arranged to generate a signal indicative of electrical signals occurring in the second branch line; and
   a monitoring device having a connection to the first and second current measuring devices, the monitoring device being arranged to register:
   a first registered signal pattern, from the first current measuring device, the first registered signal pattern comprising signals occurring on the first branch line in response to the generation of the first electrical pulse, and
   a second registered signal pattern, from the second current measuring device, the second registered signal pattern comprising signals occurring on the second branch line in response to the generation of the second electrical pulse.

2. The fault detection system of claim 1, further comprising:
   a comparison mechanism arranged to generate at least one further registered signal pattern from the addition and/or subtraction of the first registered signal pattern and the second registered signal pattern.

3. The fault detection system of claim 1, further comprising:
   a sample register arranged to store at least one sample signal pattern indicative of an expected signal pattern to be expected in a particular scenario.

4. The fault detection system of claim 3, further comprising a comparison mechanism arranged to compare at least one registered signal pattern to at least one sample signal pattern, and to generate a fault indication signal if a deviation which exceeds a deviation threshold is detected.

5. The fault detection system of claim 4, wherein the comparison mechanism is further arranged to derive, if the deviation which exceeds the deviation threshold is detected, an estimate of the distance to a fault giving rise to the deviation, and to generate a fault indication signal indicative of said distance estimate.

6. The fault detection system of claim 1, further comprising:
   a trigger device having a connection to the trigger input of the first pulse generation circuit and to the trigger input of the second pulse generation circuit via a trigger output, the trigger device being arranged to generate at least one trigger signal at the trigger output to initiate a fault detection event.

7. The line fault detecting system of claim 6, wherein the trigger device is arranged so that the at least one trigger signal can optionally be sent:
   to one of the first pulse generation circuit and the second pulse generation circuit; to the first pulse generation circuit and the second pulse generation circuit sequentially; or to the first and second pulse generation circuits simultaneously.

8. The fault detecting system of claim 1, further comprising the first and second injection lines, and wherein a variable inductance is connected in series with the first and second injection lines, respectively.

9. The line fault detection system of claim 1, wherein the pulse generation circuits are arranged in a manner so that the amplitude of the first and second electrical pulses may be varied.

10. An HVDC system including at least one electrode line having a first and second branch, the HVDC system comprising the fault detection system of claim 1 arranged to detect a line fault in at least one electrode line of the HVDC system.

11. A method of detecting a line fault in an electrode line in an HVDC system, wherein the electrode line comprises a first and second branch connected in parallel, the method comprising:
   generating a first electrical pulse onto the first branch via a first injection line;
   generating a second electrical pulse of opposite polarity to the first electrical pulse onto the second branch via a second injection line;
   registering a first registered signal pattern representing electrical signals occurring on the first branch line in response to the generation of the first electrical pulse; and
   registering a second registered signal pattern representing electrical signals occurring on the second branch line in response to the generation of the second electrical pulse.

12. The method of claim 11, further comprising:
   deriving at least one further registered signal pattern from the first and second registered signal patterns;
   comparing at least one registered signal pattern to a sample signal pattern; and, if a deviation exceeding a deviation threshold is detected:
   generating a fault indication signal.

13. The method of claim 11, wherein
the first and second electrical pulses are generated at the same point in time.

14. The method of claim 12, further comprising, if the deviation exceeding the deviation threshold is detected:
estimating the distance to a fault giving rise to the deviation.

15. The method of claim 11, further comprising
adapting the impedance of the injection lines prior to the generating of the first and second electrical pulses in order to adjust the width of the electrical pulses fed onto the branch lines.

16. The fault detection system of claim 2, further comprising:
a sample register arranged to store at least one sample signal pattern indicative of an expected signal pattern to be expected in a particular scenario.

17. The fault detection system of claim 2, further comprising:
a trigger device having a connection to the trigger input of the first pulse generation circuit and to the trigger input of the second pulse generation circuit via a trigger output, the trigger device being arranged to generate at least one trigger signal at the trigger output to initiate a fault detection event.

18. The fault detection system of claim 3, further comprising:
a trigger device having a connection to the trigger input of the first pulse generation circuit and to the trigger input of the second pulse generation circuit via a trigger output, the trigger device being arranged to generate at least one trigger signal at the trigger output to initiate a fault detection event.

19. The fault detection system of claim 4, further comprising:
a trigger device having a connection to the trigger input of the first pulse generation circuit and to the trigger input of the second pulse generation circuit via a trigger output, the trigger device being arranged to generate at least one trigger signal at the trigger output to initiate a fault detection event.

20. The fault detection system of claim 5, further comprising:
a trigger device having a connection to the trigger input of the first pulse generation circuit and to the trigger input of the second pulse generation circuit via a trigger output, the trigger device being arranged to generate at least one trigger signal at the trigger output to initiate a fault detection event.

* * * * *